United States Patent [19]

Suganuma et al.

[11] Patent Number: 4,621,207

[45] Date of Patent: Nov. 4, 1986

[54] LOGIC CIRCUIT WITH MOSFETS ARRANGED TO REDUCE CURRENT FLOW

[75] Inventors: Kazuo Suganuma; Tsuneo Hamai, both of Yokohama, Japan

[73] Assignees: Kabushiki Kaisha Toshiba; Toshiba Micro-Computer Engineering Corp., both of Kawasaki, Japan

[21] Appl. No.: 643,713

[22] Filed: Aug. 24, 1984

[30] Foreign Application Priority Data

Feb. 20, 1984 [JP] Japan ................................. 59-28481

[51] Int. Cl.[4] ................. H03K 19/017; H03K 19/094; H03K 19/20
[52] U.S. Cl. ..................................... 307/451; 307/450
[58] Field of Search ............... 307/443, 445, 448, 450, 307/451, 449, 463, 468, 469

[56] References Cited

U.S. PATENT DOCUMENTS

| 3,653,034 | 3/1972 | Regitz | 307/463 X |
| 3,769,523 | 10/1973 | Suzuki | 307/451 |
| 3,863,230 | 1/1975 | Regitz et al. | 307/449 X |
| 4,404,474 | 9/1983 | Dingwall | 307/451 X |
| 4,424,456 | 1/1984 | Shiraki et al. | 307/451 X |

FOREIGN PATENT DOCUMENTS 44-13647 6/1969 Japan .

OTHER PUBLICATIONS

Balasubramanian et al., "Two-Bit Partitioning Driver"; *IBM-TDB;* vol. 18, No. 9, pp. 2958-2959; 2/1976.

*Primary Examiner*—Larry N. Anagnos
*Attorney, Agent, or Firm*—Cushman, Darby & Cushman

[57] ABSTRACT

A logic circuit, comprising a plurality of driver MOSFETs and one load MOSFET, produces an output signal responsive to input signals. The driver MOSFETs are each controlled by an input signal and the load MOSFET is controlled by one of input signals to conduct at opposite times to the driver MOSFET controlled by the same input signal. Therefore, a logic circuit with low power consumption and a small area is provided.

26 Claims, 5 Drawing Figures

LOGIC CIRCUIT WITH MOSFETS ARRANGED TO REDUCE CURRENT FLOW

BACKGROUND OF THE INVENTION

This invention relates to logic circuits such as NOR and NAND gates for producing an output signal responsive to a plurality of input signals.

Referring now to FIG. 1, there is shown a prior art NOR circuit having four inputs. N-channel enhancement type MOSFETs Q1, Q2, Q3 and Q4 are connected in parallel between an output terminal and a ground terminal. The gate electrodes of MOSFETs Q1, Q2, Q3 and Q4 are connected to input terminals IN1, IN2, IN3 and IN4 respectively. A load element 2 is connected between a power supply terminal $V_{DD}$ and the output terminal and usually consists of a resistor or a MOSFET, the gate and source electrodes of which are connected to each other. Note that even though only one of MOSFETs Q1 through Q4 becomes conductive, a current path between the power supply and ground terminals is formed and current flows through the path. Power consumption of such a NOR circuit with a load element is very large.

Referring to FIG. 2, there is shown another prior art NOR circuit of complementary MOSFETs (CMOS FETs). N-channel enhancement type MOSFETs Q1 through Q4 are connected in parallel between the output terminal and the ground terminal. P-channel enhancement type MOSFETs Q5, Q6, Q7 and Q8 are connected in series between the power supply terminal and the output terminal. MOSFETs Q1 and Q5, Q2 and Q6, Q3 and Q7 and Q4 and Q8 are connected to input terminals IN1, IN2, IN3 and IN4 through the gate electrodes respectively. When MOSFET Q1 is conductive, MOSFET Q5 is not conductive and no current path between the power supply terminal and the ground-terminal is formed. In this way, power consumption of the NOR circuit of CMOSFETs is very small. However, the number of transistors in such a circuit is twice that of input terminals. This results in complex wiring and a larger area than that of a NOR circuit which uses a load element. Moreover, when the logic level of the output signal responsive to input signals changes to a logic "1", the voltage of the power supply terminal is transmitted through MOSFETs Q5, Q6, Q7 and Q8. Therefore it takes longer to change its output to a logic "1" than a circuit with a load element.

SUMMARY OF THE INVENTION

It is an object of this invention to provide a logic circuit with low power consumption and a small area.

According to the invention, a logic circuit for producing an output signal responsive to input signals comprises first and second power source terminals, an output terminal, plurality of MOSFETs of first conductivity type connected between the first power source terminal and the output terminal in parallel and controlled by input signals respectively and a MOSFET of second conductivity type connected between the second power source terminal and the output terminal and controlled by one of the input signals.

DETAILED DESCRIPTION

Figure 3:
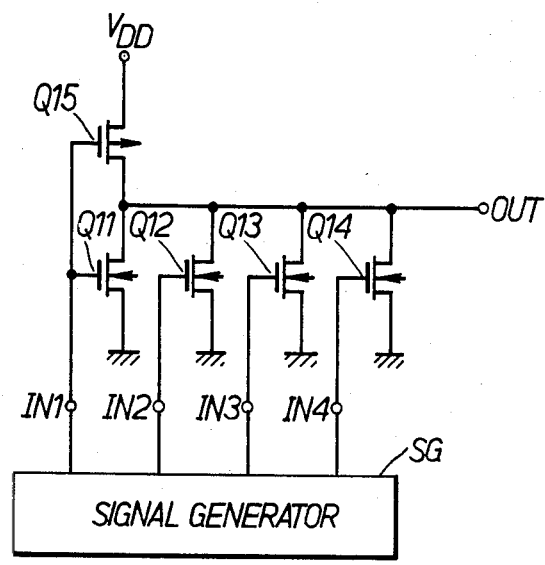
FIG. 3 shows a NOR circuit of a preferred embodiment of the invention.

Referring now to the drawings, there is shown in FIG. 3 a NOR circuit in accordance with the present invention. N-channel enhancement type MOSFETs Q11, Q12, Q13 and Q14 are connected in parallel between an output terminal and a ground terminal. The gate electrodes of MOSFETs Q11, Q12, Q13 and Q14 are connected to input terminals IN1, IN2, IN3 and IN4, respectively, which are, in turn, connected to signal generator SG. Signal generator SG may be any logic circuit. A P-channel enhancement type MOSFET type Q15 is connected between a power supply terminal $V_{DD}$ and the output terminal. The gate electrode of MOSFET Q15 is connected to input terminal IN1. The channel resistance of MOSFET Q15 is set larger than that of each one of MOSFETs Q11 through Q14.

When the logic level of input terminal IN1 is a logic "1", MOSFET Q11 is conductive and MOSFET Q15 is nonconductive. Therefore, the logic level of the output terminal is a logic "0" without reference to the logic levels of input terminals IN2, IN3 and IN4. In this state, no current path between the power supply terminal and the ground terminal is formed and current does not flow.

When the logic level of input terminal IN2 is a logic "0", MOSFET Q11 is nonconductive and MOSFET Q15 is conductive. Additionally, if the logic level of at least one of input terminals IN2, IN3 and IN4, for example IN2, is a logic "1", MOSFET Q12 is conductive and a current path through MOSFETs Q15 and Q12 between the power supply terminal and the ground terminal is formed. Therefore, the logic level of the output terminal is a logic "0". It is effective for low power consumption to make the channel resistance of MOSFET Q15 big.

When all logic levels of input terminals IN1 through IN4 are a logic "0", only MOSFET Q15 is conductive. Therefore, no current path is formed and the logic level of the output terminal is a logic "1".

Figure 1:
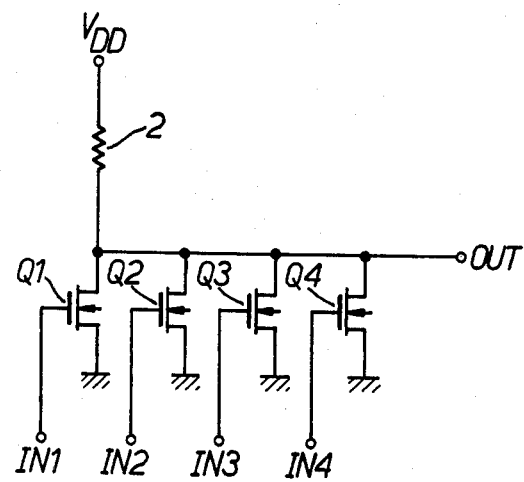
FIG. 1 shows a prior art NOR circuit.
Figure 2:
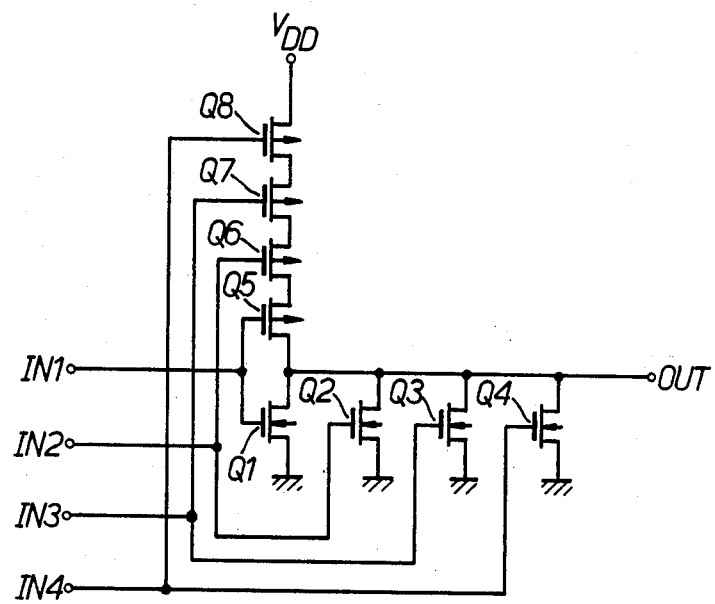
FIG. 2 shows another prior art NOR circuit.

The number of elements of this circuit is the same as that of the prior art circuit shown in FIG. 1 and is less than that of the prior art circuit shown in FIG. 2. Therefore, this circuit is suitable for a large scale integrated circuit.

Since current does not flow in this circuit when the logic level of the input terminal IN1 is a logic "1", power consumption of this circuit is smaller than that of the circuit which uses a load element like the prior art circuit shown in FIG. 1.

Usually, signal generator SG generates different input signals to be applied to input terminals IN1 through IN4 and the period during which the logic levels of the input signals are a logic "1" are different from each other. Keep in mind that the current path between the power supply terminal and the ground terminal is not formed when the logic level of the input terminal IN1 is a logic "1" independent of the logic levels of input terminals IN2, IN3 and IN4. Therefore, power consumption of this circuit is made smallest if the input signal from signal generator SG that has the longest period during which the logic level is a logic "1" is applied to the input terminal IN1.

Moreover, the voltage of the power supply terminal is transmitted only through MOSFET Q15 to the output terminal when all logic levels of input terminals IN1 through IN4 are a logic "0". Therefore, the time required to output a logic "1" is shorter than that of the prior art circuit shown in FIG. 2.

Figure 4:
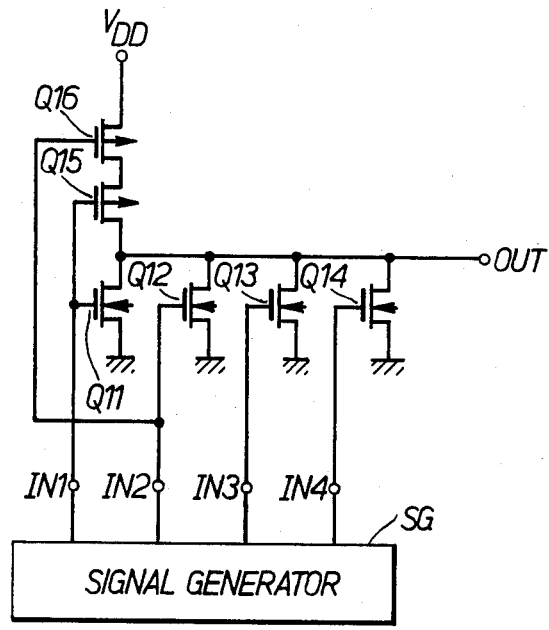
FIG. 4 shows a NOR circuit of another embodiment of the invention.

Referring to FIG. 4, there is shown another embodiment of this invention. This NOR circuit is identical to that of FIG. 3 with the addition of a P-channel MOSFET Q16 connected between the power supply terminal $V_{DD}$ and MOSFET Q15. The gate electrode of MOSFET Q16 is connected to input terminal IN2. The total resistance of the channel resistances of MOSFETs Q15 and Q16 is set larger than that of each one of MOSFETs Q11 through Q14.

When the logic level of at least one of input terminals IN1 and IN2 is a logic "1", no current path between the power supply terminal and the ground terminal is formed. Therefore, power consumption of this circuit is smaller than that of the circuit shown in FIG. 3.

In the embodiments shown in FIGS. 3 and 4, MOSFETs Q15 and Q16 are enhancement type. However, MOSFETs Q15 and Q16 may be depletion type.

Figure 5:
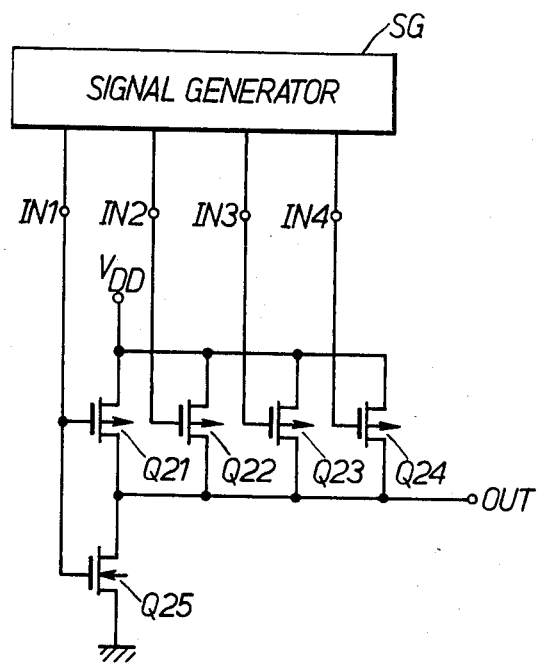
FIG. 5 shows a NAND circuit of yet another embodiment of the invention.

Referring now to FIG. 5, there is shown a NAND circuit in accordance with the present invention. P-channel enhancement type MOSFETs Q21, Q22, Q23 and Q24 are connected in parallel between the power supply terminal $V_{DD}$ and the output terminal. The gate electrodes of MOSFETs Q21, Q22, Q23 and Q24 are connected to input terminals IN1, IN2, IN3 and IN4, respectively, which are, in turn, connected to signal generator SG. A N-channel MOSFET of enhancement type Q25 is connected between the output terminal and the ground terminal. The gate electrode of MOSFET Q25 is connected to input terminal IN1. The channel resistance of MOSFET Q25 is larger than that of each one of MOSFETs Q21 through Q24.

When the logic level of input terminal IN1 is a logic "0", MOSFET Q21 is conductive and MOSFET Q25 is nonconductive. Therefore, no current path between the power supply terminal and the ground terminal is formed and the logic level of the output terminal is a logic "1".

When the logic level of input terminal IN1 is a logic "1" and the logic level of at least one of input terminals IN2, IN3 and IN4, for example IN2, is a logic "0", MOSFETs Q22 and q25 are conductive. Therefore, a current path between the power supply terminal and the ground terminal is formed and the logic level of the output terminal is a logic "1".

When all logic levels of input terminals IN1 through IN4 are a logic "1", only MOSFET Q25 is conductive. Therefore, no current path between the power supply terminal and the ground terminal is formed and the logic level of the output terminal is a logic "0".

This NAND circuit also achieves low power consumption, small area and high speed.

While this invention has been described with reference to illustrative embodiments, this description is not intended to be construed in a limiting sense. Various modifications of the embodiments will be apparent to persons skilled in the art upon reference to this description. It is, therefore, contemplated that the appended claims will cover any such modifications or embodiments as fall within the true scope of the invention.

What is claimed is:

1. A logic circuit for producing an output signal responsive to input signals comprising:
   first and second power source terminals;
   and output terminal;
   a plurality of MOSFETs of a first conductivity type having current conducting terminals connected in parallel between said first power source terminal and said output terminal, each of said MOSFETs being controlled by one of said input signals, respectively, and
   only one MOSFET of a second conductivity type having current conducting terminals connected between said second power source terminal and output terminal and controlled by one of said input signals which necessarily controls one of said plurality of MOSFETs, the channel resistance of said MOSFET of second conductivity type when conducting being larger than that of each one of said MOSFETs of first conductivity type when conducting.

2. A logic circuit according to claim 1 wherein said MOSFETs of first conductivity type are N-channel MOSFETs and said MOSFET of second conductivity type is a P-channel MOSFET.

3. A logic circuit according to claim 2 wherein said N-channel MOSFETs and P-channel MOSFET are enhancement type.

4. A logic circuit according to claim 3 wherein the voltage applied to said first power source terminal is lower than the voltage applied to said second power source terminal.

5. A logic circuit according to claim 2 wherein said N-channel MOSFETs are enhancement type and said P-channel MOSFET is depletion type.

6. A logic circuit according to claim 5 wherein the voltage applied to said first power source terminal is lower than the voltage applied to said second power source terminal.

7. A logic circuit according to claim 1 wherein said MOSFETs of first conductivity type are P-channel MOSFETs and said MOSFET of second conductivity type is a N-channel MOSFET.

8. A logic circuit according to claim 7 wherein said P-channel MOSFETs and N-channel MOSFET are enhancement type.

9. A logic circuit according to claim 8 wherein the voltage applied to said first power source terminal is higher than the voltage applied to said second power source terminal.

10. A logic circuit according to claim 7 wherein said P-channel MOSFETs are enhancement type and said N-channel MOSFET is depletion type.

11. A logic circuit according to claim 10 wherein the voltage applied to said first power source terminal is higher than the voltage applied to said second power source terminal.

12. A logic circuit according to claim 1 further comprising means for generating said input signals, said generating means applying to said MOSFET of second conductivity type, one of said input signals which has a binary level for a greater percentage of time than any other of said input signals, said level causing said MOSFET of second conductivity type to be nonconductive.

13. A logic circuit for producing an output signal responsive to input signals comprising:
   first and second power source terminals;
   an output terminal;

a plurality of MOSFETs of first conductivity type having current conducting terminals connected in parallel between said first power source terminal and output terminal, each of said MOSFETs being controlled by one of said input signals, respectively, and a plurality of MOSFETs of second conductivity type having current conducting terminals connected in series between said second power source terminal and output terminal, each of said MOSFETs of second conductivity type being controlled by one of said input signals which necessarily controls one of said plurality of MOSFETs of first conductivity type, respectively, the number of MOSFETs of second conductivity type being less than that of said MOSFETs of first conductivity type, the total resistance of the channel resistance of said MOSFETs of second conductivity type when conducting is larger than that of each one of said MOSFETs of first conductivity type when conducting.

14. A logic circuit according to claim 13 wherein said MOSFETs of first conductivity type are N-channel MOSFETs and said MOSFETs of second conductivity type are P-channel MOSFETs.

15. A logic circuit according to claim 14 wherein said N-channel MOSFETs and P-channel MOSFETS are enhancement type.

16. A logic circuit according to claim 15 wherein the voltage applied to said first power source terminal is lower than the voltage applied to said second power source terminal.

17. A logic circuit according to claim 14 wherein said N-channel MOSFETs are enhancement type and said P-channel MOSFETS are depletion type.

18. A logic circuit according to claim 17 wherein the voltage applied to said first power source terminal is lower than the voltage applied to said second power source terminal.

19. A logic circuit according to claim 13 wherein said MOSFETs of first conductivity type are P-channel MOSFETs and said MOSFETs of second conductivity type are N-channel MOSFET.

20. A logic circuit according to claim 19 wherein said P-channel MOSFETs and N-channel MOSFETs are enhancement type.

21. A logic circuit according to claim 20 wherein the voltage applied to said first power source terminal is higher than the voltage applied to said second power source terminal.

22. A logic circuit according to claim 19 wherein said P-channel MOSFETs are enhancement type and said N-channel MOSFETs are depletion type.

23. A logic circuit according to claim 22 wherein the voltage applied to said first power source terminal is higher than the voltage applied to said second power source terminal.

24. A logic circuit according to claim 13 further comprising means for generating said nput signals, said generating means applying to said MOSFETs of second conductivity type those input signals which cause at least one of said MOSFETs of second conductivity type to be nonconductive for the greatest percentage of time.

25. A logic circuit for producing an output signal responsive to binary input signals comprising:

means for generating said input signals, one of said input signals having a binary level for a greater percentage of time than any of the other said input signals;

first and second power source terminals;

an output terminal;

a plurality of MOSFETs of a first conductivity type having current conducting terminals connected in parallel between said first power source terminal and said output terminal, each of said MOSFETs being controlled by one of said input signals including said one input signal, respectively, to be conductive in response to said binary level; and at least one MOSFET of a second conductivity type having current conducting terminals connected between said second power source terminal and output terminal, one of said at least one MOSFET being controlled by said one input signal to be nonconductive in response to said binary level, any other of said at least one MOSFET each being controlled by a different one of said input signals which necessarily control any of said plurality of MOSFETs, respectively, the number of said at least one MOSFET being less than that of said MOSFETs of said first conductivity type, the channel resistance of said at least one MOSFET when conducting being larger than that of each one of said plurality of MOSFETs when conducting.

26. A logic circuit as in claim 25 wherein said at least one MOSFET consists of only one MOSFET.

* * * * *